United States Patent [19]
Dubuisson et al.

[11] Patent Number: 4,630,171
[45] Date of Patent: Dec. 16, 1986

[54] SUPPORT FOR A HIGH-SPEED COMPONENT, IN PARTICULAR A MICROWAVE FREQUENCY COMPONENT, THE SUPPORT INCLUDING INCORPORATED DECOUPLING MEMBERS

[75] Inventors: Jacques Dubuisson; Pascal Le Gal, both of Paris, France

[73] Assignee: Eurofarad-EFD, Paris, France

[21] Appl. No.: 674,387

[22] Filed: Nov. 23, 1984

[30] Foreign Application Priority Data

Nov. 22, 1983 [FR] France ............................. 83 18571

[51] Int. Cl.$^4$ ................ H01G 4/10; H01G 7/00; H05K 1/16
[52] U.S. Cl. .................... 361/321; 29/25.42; 361/402
[58] Field of Search ............ 29/25.42; 361/306, 328, 361/329, 330, 400, 402, 404, 320, 321; 357/51

[56] References Cited
U.S. PATENT DOCUMENTS 3,480,836 11/1969 Aronstein ....................... 361/400 X
4,470,099 9/1984 Sawairi ............................. 361/328
4,539,622 9/1985 Akasaki ........................ 361/402 X Primary Examiner—Donald A. Griffin
Attorney, Agent, or Firm—Pollock, Vande Sande & Priddy

[57] ABSTRACT

The invention relates to a support (100) for a high-speed component (30) in particular a hyperfrequency component. The support is in the form of a stack of high dielectric constant ceramic sheets which are sintered and which are suitable for receiving surface metallization (21-24) to constitute connections to the terminals of the component.

According to the invention, the support includes a central zone (110) emerging in the surface of the support with substantially the same area as the supported component (30) and is immediately adjacent to the location of the future supported component. This zone is formed of low dielectric constant material. Outside the central zone and peripheral thereto, the support includes at least one internal metallization (131, 132) at shallow depth (e) formed by a conductive pattern carried by one of the sheets of the stack and connected to a ground connection (141, 142). Each portion of the internal metallization (131, 132) corresponds to a portion of the surface metallization (21, 22) and is located opposite said corresponding portion so as to constitute a decoupling capacitor for the terminal of the supported component which is connected to the said corresponding portion of the surface metallization.

11 Claims, 11 Drawing Figures

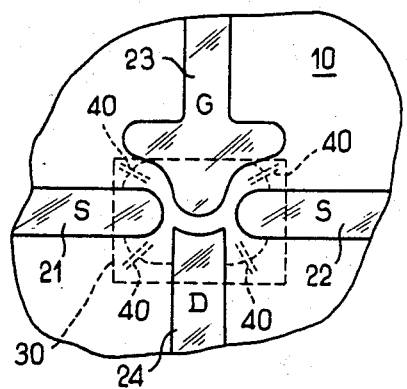
FIG_1
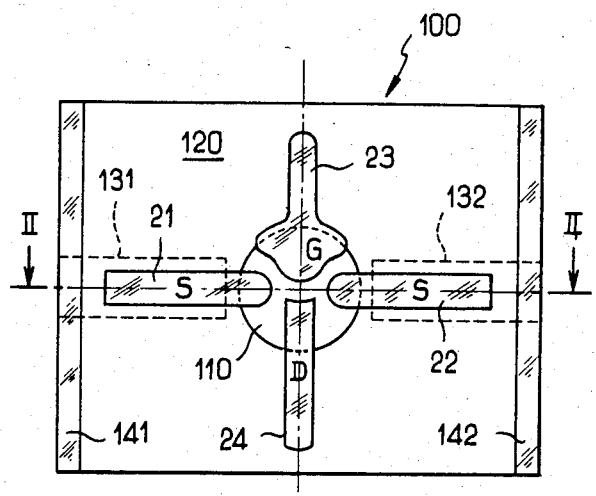
FIG_3
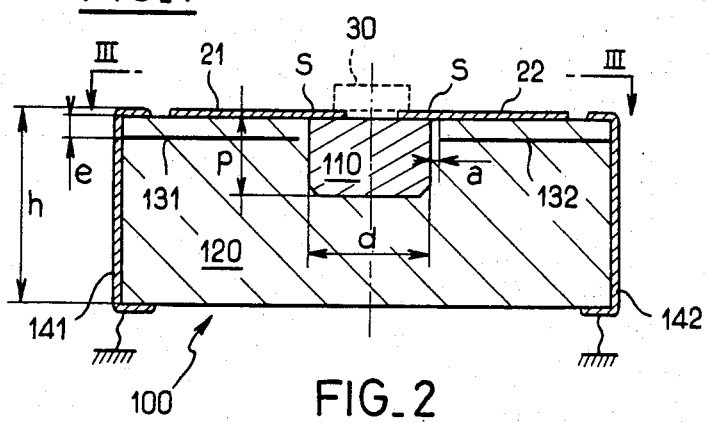
FIG_2
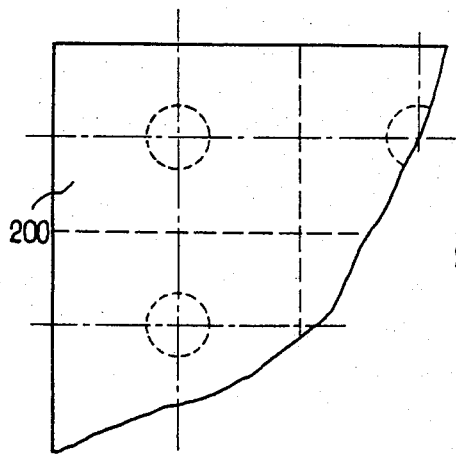
FIG_4
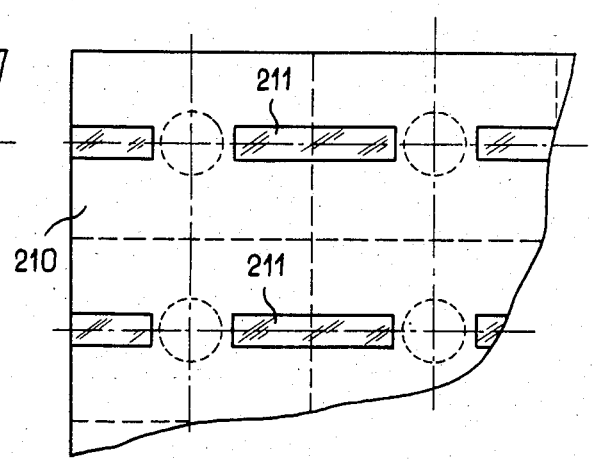
FIG_5

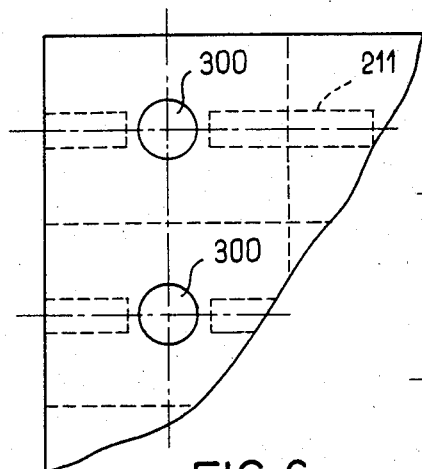
FIG_6
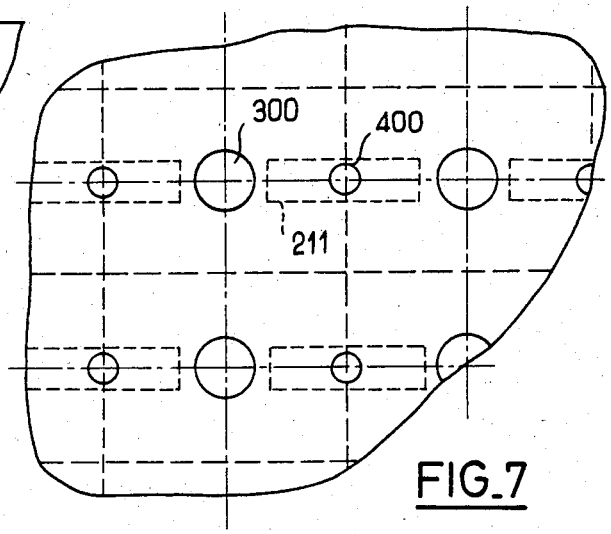
FIG_7
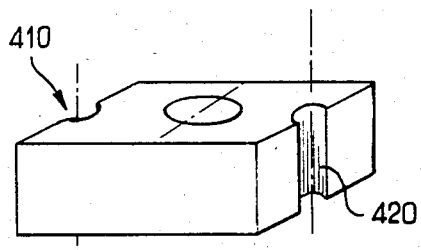
FIG_8
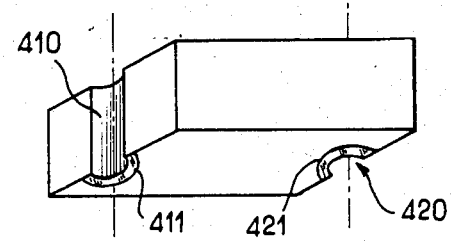
FIG_9
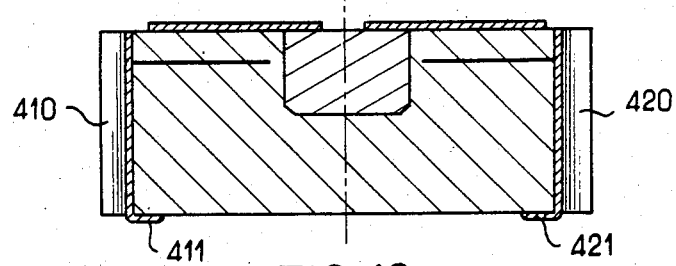
FIG_10
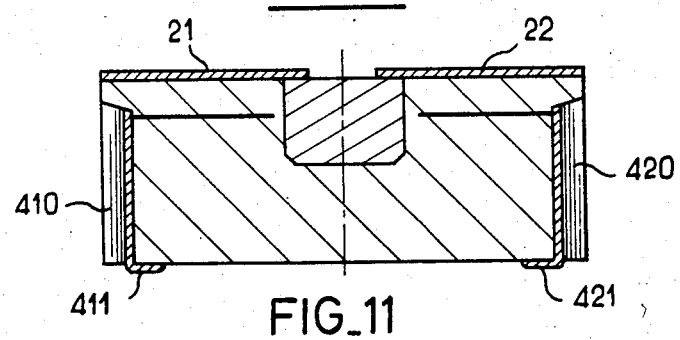
FIG_11

SUPPORT FOR A HIGH-SPEED COMPONENT, IN PARTICULAR A MICROWAVE FREQUENCY COMPONENT, THE SUPPORT INCLUDING INCORPORATED DECOUPLING MEMBERS

The present invention relates to a support for a high-speed component.

It is applicable to all high-speed devices, in particular to microwave frequency components and to bipolar or field effect transistors, most particularly those made on a substrate of gallium arsenide. Because of their high working frequencies, such components require very thorough decoupling for some of their electrodes (e.g. the source(s) of a field effect transistor (FET)), which requires a capacitance to be provided as close as possible to said electrodes requiring decoupling in order to avoid any inductive effect due to an excessively long connection, which would cause the device to lose its high-speed advantages.

However, it is also necessary to avoid any capacitive coupling between the various electrodes of the component (e.g. between the drain and the gate or between two sources of an FET), at microwave frequencies gain falls off very rapidly as soon as such spurious capacitances reach values of a few picofarads.

In practice, the supports used are either high dielectric constant supports in which the spurious or stray capacitances between electrodes set the high frequency performance limit, or else low dielectric constant supports are used which do not provide adequate decoupling and which thus require capacitor components to be added thereto, thereby requiring extra connections and thus complicating manufacture and running the risk of producing inductive effects.

Preferred embodiments of the invention avoid these drawbacks by providing a support which provides both excellent decoupling for some of the electrodes of a component while avoiding any capacitive coupling between the electrodes of the component. This support is of the type constituted by a sintered block of a stack of ceramic sheets each being of high dielectric constant. It is suitable for receiving surface metallization for forming connections to the terminals of the component.

According to the invention, the support includes a central zone emerging at the surface of the support and extending substantially over the area of the supported component, said central zone being formed of a material having a low dielectric constant; outside said central zone, around said central zone and under the surface of the support at shallow depth there is internal metallization formed by a conductive pattern borne by one of the sheets of the stack and connected to a ground connection, the internal metallization and one of the surface metallizations having surfaces which are opposite to each other so as to constitute a decoupling capacitor for the terminal of the component which is connected to said surface metallization.

Naturally, the invention relates both to a support which is already provided with surface metallization, i.e. ready to receive a component, and to a support which has not yet received its surface metallization. It will be seen below, that the surface metallization does not need to be deposited during the manufacturing of the support per se. Thus, in some cases, users may prefer to deposit their own surface metallization, thereby giving it the shape and configuration desired suitable for any given application.

In a first embodiment, the low dielectric constant material is a vitroceramic, i.e. a low melting point crystallized glass impregnated with dielectric material. The vitroceramic is chosen so as to be compatible with the dielectric ceramic under mechanical and thermal stress.

In a second embodiment, the low dielectric constant material is a ceramic based on magnesia titanate, which has sintering properties close to those of high dielectric constant dielectrics, and is also compatible, after sintering, under thermal and mechanical stress.

Further, and advantageously, the high dielectric constant ceramic is a ceramic based on barium titanate with, for example, added oxides of praseodymium and neodymium.

The invention also relates to a method of manufacturing such a support, the method comprising the steps of:
  stacking sheets of raw ceramic, with at least one of the sheets having a conductive pattern thereon, and at least the last sheet of the stack being a sheet of dead ceramic of suitable thickness for forming a dielectric;
  compressing and drying the stack;
  forming a hole which may be blind and passed right through the stack, at the location of the central zone in such a manner as to form a recess;
  firing the ceramic for a first time;
  filling the recess with a material of low dielectric constant (a glass or a ceramic);
  firing the filling material;
  rectification;
  polishing; and
  cutting up into unit members.

Advantageously, the first firing step is replaced by a single co-firing step during the second firing step to fire both the ceramic and the filler material. This variant is particularly advantageous when the low dielectric constant material is a ceramic.

Other characteristics and advantages of the invention will appear on reading the detailed description below, given with reference to the accompanying drawings, in which:

FIG. 1 is a diagrammatic plan view showing the disposition of the electrodes for connection to a component in a conventional support;

FIG. 2 is a section in line II—II of FIG. 3 through a support in accordance with the invention;

FIG. 3 is a plan view on a line III—III of FIG. 2 of the same support;

FIGS. 4 to 6 show stages in the formation of the stack of ceramic sheets and the formation of a hole in the stack;

FIG. 7 shows a variant of FIG. 6 in which the support includes connection sockets in the form of plated-through holes;

FIGS. 8 and 9 are perspective views from above and below respectively of a component corresponding to the FIG. 7 variant;

FIG. 10 is a section similar to FIG. 2 through a component corresponding to the FIG. 7 variant; and FIG. 11 is a similar view to FIG. 10 for another variant embodiment.

FIG. 1 is a plan view showing connections 21 to 24 disposed on the surface of a conventional type substrate 10, with the component 30 for connection thereto being shown in dashed lines.

Here and in what follows, the component used as an example is a field effect transistor, however this example should not be taken as being limiting. The two electrodes 21 and 22 are thus electrodes for connection to the sources of the transistor while the electrodes 23 and 24 are for connection respectively to the gate and to the drain.

If the support 10 is made of a ceramic having a high dielectric constant, and if an internal electrode is provided inside the support connected to ground (not shown), it is possible to provide good decoupling for both sources, i.e. for the two electrodes 21 and 22, by suitably plating the internal electrode in such a manner as to have a capacitance of about 10 pF to 60 pF depending on the operating frequency.

In contrast, it is impossible to avoid the appearance of stray capacitance (shown at 40) between the various electrodes. This stray capacitance is inherent to the high dielectric constant of the material used and once the value thereof exceeds a few picofarads, it greatly reduces the performance of the component when mounted on the support.

To migitate this drawback, the invention proposes a support 100 shown in FIGS. 2 and 3 in section and as a plan view respectively. The support is constituted by a sintered block 120 of high dielectric constant ceramic in the middle of which there is an emerging central zone 110 extending substantially over the same area as the place 30 occupied by the component which is to be applied thereto. This central zone is made of a low dielectric constant material.

Herein, and in what follows, the term "low dielectric constant" is used to designate a dielectric constant of less than 100, and the term "high dielectric constant" is used to designate a dielectric constant greater than 1000.

To decouple the surface electrodes 31 and 32 (corresponding to the electrodes connected to the sources of the transistor) electrodes 131 and 132 are provided at a shallow depth e below the surface of the substrate in the high dielectric constant region. These internal electrodes 131 and 132 are placed opposite surface electrodes 21 and 22 (as can be seen in FIG. 3) so that each source is connected to a decoupling capacitor. The electrodes 131 and 132 are also connected to ground by one or more connections 141, 142 in the form of metallization external to the support.

The internal electrodes 131 and 132 may, for example, be constituted by a conductive pattern carried by one of the sheets in the stack of the sintered block.

In one embodiment, the dimensions of the support are as follows: height h=1.2 mm; diameter of the central zone d=0.9 mm; depth of the central zone p=0.4 mm; thickness of the dielectric layer constituting the capacitance e=50 μm; guard space between the electrodes and the central zone a=0.3 mm. The width and the length of the internal electrode 131 and 132 are chosen as a function of the desired decoupling capacitance. The size and shape of the surface electrodes 21 to 24 are chosen so as to minimize stray capacitance and stray inductance.

A support of this nature is suitable for microwave components which are specifically in the form of a 0.3×0.3 mm chip.

The high dielectric constant ceramic is preferably chosen as a barium titanate based ceramic with added oxides of praseodymium and neodymium.

The following composition which has a dielectric constant of 2700 at 1 kHz is particularly suitable in the present case:

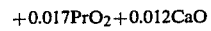

 (proportions given in moles), together with alumina and silica additives.

The low dielectric constant material used in a preferred embodiment is a vitroceramic, i.e. a crystallized glass having a low melting point and impregnated with a dielectric material. A suitable material in the present application is, for example, composed of 40 to 65% by weight of lead borosilicate, 5% to 25% by weight of bismuth oxide; and 3% to 30% by weight of titanium oxide or cadmium oxide. Such a material has a melting point and an expansion coefficient which are close to the those of the high dielectric constant ceramic, thereby ensuring that it is completely compatible therewith.

From the dielectric point of view, such a vitroceramic has a constant of about 2.4 at 1 kHz thus avoiding the appearance of any stray capacitance between the various electrodes of the component.

In another embodiment, the low dielectric constant material is a ceramic based on magnesia titanate.

The following formulation is particularly appropriate:

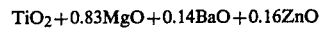

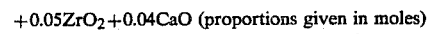 (proportions given in moles)

together with traces of silica and alumina.

This ceramic has a dielectric constant of 25 at 1 kHz. Additionally it is compatible from the point of view of firing temperature and shrinkage on firing with the high dielectric constant ceramic used for the rest of the support.

The method of manufacturing the support in accordance with the invention is now described.

Initially, a stack of unit sheets of raw ceramic (each having a thickness of about 50 μm when raw) is made; in particular, an initial stack of n sheets such as the sheet shown at 200 in FIG. 4 is made, then a sheet is added thereto having metallization 211 for constituting the internal plates of the decoupling capacitances (see sheet 210 of FIG. 5); and finally one or more sheets of dead ceramic identical to the sheets 200 are added to produce a suitable thickness for constituting the dielectric of the decoupling capacitances. In FIGS. 4 and 5, dashed lines show the position of the future central zone and also the lines along which the support will be cut apart in order to split it into individual supports.

In a second step, the stack of raw ceramic sheets is compressed and dried in conventional manner.

After this steps, holes are made therein, which holes may be blind or holes which may pass right through the stack, at the locations of the central zones for the individual supports, thereby constituting a recess in each support. In FIG. 6, these recesses are marked 300 and the conductor patterns 211 are shown in dashed lines since they are now buried inside the ceramic.

There follows a first firing operation of the ceramic at high temperature, e.g. 1267° C. for the ceramic composition mentioned above.

The following step consists in filling the recesses 300, either with a vitreous ceramic or else with a ceramic, with either material having as low a dielectric constant as possible and a coefficient of expansion which matches that of the high dielectric constant ceramic.

There then follows a second firing operation at low temperature (about 750° C.) of the filler material.

The block is then rectified so as to be completely plane and so as to adjust the thickness e of the dielectric in the future decoupling capacitors. This step is followed by a polishing operation.

Finally, the unit supports are individualized by being cut apart, e.g. by means of a saw.

External metallization is then deposited on each individual support, e.g. by wetting the ends of the block in a conductive varnish which is then dried and hardened.

In an advantageous variant of the method, which is in particular appropriate to the embodiment where the low dielectric constant material is a ceramic, the first firing step is omitted and is replaced by a single co-firing step at the above-described second firing step. The two ceramics are therefore chosen to have the same shrinkage and same firing temperatures in order to make co-firing possible.

Further, as has been mentioned, the recess constituting the central zone is made by drilling a hole prior to firing. However, other techniques could be used (e.g. sand blasting or laser drilling) which could give rise to recesses of various shapes other than that shown in the figures (e.g. a recess in the shape of a truncated cone to sand erosion).

Further, if is desired to make supports which are already provided with surface-connecting metallization for connection to the electrodes of the component, these surface metallizations can be made collectively by vacuum evaporation or by cathode sputtering followed by chemical etching after suitable masking. This may be done between the polishing and cutting up steps of the above method.

FIGS. 7 to 10 relate to a variant embodiment of the external metallization constituting the ground connection. It is advantageous, instead of metallizing one or more side faces of the block to make the connections to the internal electrodes 211 via holes 400 which open out to the bottom face of the component. These holes may pass right through the component or they may be blind holes drilled from the bottom face. The holes may be made at the same time as the recesss 300 and are subsequently metallized.

The support may be cut up into unit supports through the metallized or plated-through holes as shown in FIG. 7. This provides a support as shown in FIGS. 8 and 9 in which the ground connection is made via semi-cylindrical notches 410 and 420 in the sides thereof. These notches are preferably metallized by metallization which continues over the lower face of the support via overlaps 411 or 421 suitable for making subsequent ground connections (FIGS. 9 and 10).

In a variant, the hole is a blind hole (FIG. 11) thereby enabling the surface electrodes 21 and 22 to reach the sides of the unit support.

We claim:

1. A support (100) for a high-speed component (30), in particular a microwave frequency component, in the form of a sintered block constituted by a stack of high dielectric constant ceramic sheets suitable for receiving surface metallization (21-24) for constituting connections to the terminals of a component supported by the support;

characterized in that the support comprises a central zone (110) which emerges at the surface of the support and which extends over substantially the same area as supported component (30), said central zone being formed by a material having a low dielectric constant;

and in that the support is provided, outside the central zone and peripheral thereto, with at least one internal layer of metallization (131, 132) underneath the surface of the support and at shallow depth (e), said metallization being formed by a conductive pattern carried by one of the sheets of the stack and connected to a ground connection (141, 142), the internal metallization (131; 132) being opposite at least one part of the surface metallization (21; 22) in order to constitute therewith a decoupling capacitor for connection to at least one of the terminals of a component carried by the support.

2. A support according to claim 1, characterized in that the ground connection is formed by metallization (141, 142) connected over the full height of one of the side faces of the block, and electrically connected to the conductive pattern by a portion thereof which emerges in said side face.

3. A support according to claim 1, characterized in that the ground connection is formed by a plated-through hole (410, 420) or by a portion of a hole which may be blind or which may pass through the support, and which passes through the conductive pattern.

4. A support according to claim 3, characterized in that the metallization (410, 420) is extended to overlap (411, 412) the bottom face of the substrate.

5. A support according to claim 1, characterized in that the low dielectric constant material is a vitroceramic.

6. A support according to claim 1, characterized in that the low dielectric constant material is a ceramic based on magnesia titanate.

7. A support according to claim 1, characterized in that the high dielectric constant ceramic is a ceramic based on barium titanate.

8. A method of manufacturing a support according to claim 1, characterized in that the method comprises the following steps:

stacking raw ceramic sheets (200, 210) including at least one sheet (210) with a conductive pattern (211) thereon, at least the last sheet of the stack being a dead ceramic sheet of suitable thickness for constituting a dielectric;

compressing and drying the stack;

forming a hole (300) which may be blind or which may pass through the stack at the position of the central zone so as to constitute a recess;

a first firing operation for firing the ceramic;

filling the recess with a material (a glass or a ceramic), of low dielectric constant;

a second firing operation for firing the filler material;

rectification;

polishing; and cutting up into unit support members.

9. A method according to claim 8, characterized in that the first firing step is omitted and the second firing step is replaced by a single co-firing step for firing both the ceramic and the filler material.

10. A method according to claim 8, for manufacturing a support according to claim 3, characterized in that the method includes, prior to polishing, a step of forming holes (400) for constituting the ground connections, together with a set for metallizing said holes.

11. A method according to claim 10, characterized in that the support is cut up into unit support members through the metallized holes.

* * * * *